(12) United States Patent
Richards, III et al.

(10) Patent No.: US 9,612,603 B2
(45) Date of Patent: Apr. 4, 2017

(54) CALIBRATION OF VOLTAGE REGULATOR

(71) Applicant: Dell Products, L.P., Round Rock, TX (US)

(72) Inventors: George G. Richards, III, Round Rock, TX (US); Abey K. Mathew, Georgetown, TX (US); John E. Jenne, Austin, TX (US); Ralph H. Johnson, III, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 273 days.

(21) Appl. No.: 14/334,122

(22) Filed: Jul. 17, 2014

(65) Prior Publication Data

US 2016/0018833 A1    Jan. 21, 2016

(51) Int. Cl.
*G06F 1/26* (2006.01)
*G01R 15/00* (2006.01)
*G01R 21/06* (2006.01)
*G05F 1/46* (2006.01)
*G01R 31/40* (2014.01)
*G01R 35/00* (2006.01)

(52) U.S. Cl.
CPC ............... *G05F 1/46* (2013.01); *G01R 31/40* (2013.01); *G01R 35/00* (2013.01); *G06F 1/26* (2013.01)

(58) Field of Classification Search
CPC G06F 1/26; G01R 31/40; G01R 35/00; G05F 1/46
USPC ...................... 713/300; 702/57, 60
See application file for complete search history.

(56) References Cited

U.S. PATENT DOCUMENTS

| 7,863,876 B2 * | 1/2011 | Cook | G05F 1/575 323/280 |
|---|---|---|---|
| 2008/0168287 A1 * | 7/2008 | Berry | G06F 1/266 713/323 |
| 2011/0258477 A1 * | 10/2011 | Baker | G06F 1/3203 713/600 |
| 2013/0339777 A1 * | 12/2013 | Varma | G06F 1/26 713/340 |

(Continued)

OTHER PUBLICATIONS

Huang et al., "System Accuracy Analysis of the Multiphase Voltage Regulator Module", IEEE Transactions on Power Electronics, vol. 22, No. 3, May 2007, pp. 1019-1026.*

*Primary Examiner* — Ji H Bae
(74) *Attorney, Agent, or Firm* — Fogarty LLP

(57) ABSTRACT

A voltage regulator calibrator analyzes voltage regulator output and compares the output with known electrical loads. The calibrator selects a known electrical load, applies the known electrical load to a voltage regulator, receives from the voltage regulator measured output power characteristics of the voltage regulator, compares the known electrical load with the measured output power characteristics, and generates a voltage regulator adjustment value based on the compared values. Embodiments of the present disclosure also include a method for calibrating, the method including selecting a known electrical load, applying the known electrical load to a voltage regulator, receiving measured output power characteristics of the voltage regulator, comparing the known electrical load with the measured output power characteristics, and generating a voltage regulator adjustment value based on the compared values.

21 Claims, 6 Drawing Sheets

(56) References Cited

U.S. PATENT DOCUMENTS

2014/0097816 A1* 4/2014 Chen ................... G05F 1/575
              323/283
2015/0370300 A1* 12/2015 Luo ..................... G06F 1/28
              711/103

* cited by examiner

CALIBRATION OF VOLTAGE REGULATOR

TECHNICAL FIELD

The embodiments of the disclosure relate generally to the field of information handling systems, and more specifically, to calibrating current of a voltage regulator operable within the information handling system.

BACKGROUND

An information handling system ("IHS") generally processes, compiles, stores, and/or communicates information or data for business, personal, or other purposes thereby allowing users to take advantage of the value of the information. An IHS may include a voltage regulator to provide a constant voltage level to power the system. For example, a voltage regulator may receive an input voltage and produce an output current at a predetermined output voltage required by a load, i.e., the circuit element(s) for which it is providing power. Modern IHSs may include components that maintain current requirements across a broad range from relatively high peak currents to very low stable currents. Voltage regulators may be required to maintain a high efficiency, or low power loss, over such ranges.

Currently, higher-level power management features are being implemented by some of the components in the IHS, such as a CPU. These higher-level power management features are dependent upon input and/or output measurements of the voltage regulator. Often times, inaccuracies in the output measurements of the voltage regulator can lead to inconsistent performance because, for example, power-capping algorithms and thermal control algorithms are impacted by inaccurate output readings from the voltage regulator.

SUMMARY

The following presents a general summary of several aspects of the disclosure in order to provide a basic understanding of at least some aspects of the disclosure. This summary is not an extensive overview of the disclosure. It is not intended to identify key or critical elements of the disclosure or to delineate the scope of the claims. The following summary merely presents some concepts of the disclosure in a general form as a prelude to the more detailed description that follows.

One aspect of the disclosure provides for a method for calibrating a voltage regulator in an information handling system. The method may include selecting a known electrical load, applying the known electrical load to a voltage regulator, and receiving measured output power characteristics of the voltage regulator. The method may also include comparing the known electrical load with the measured output power characteristics, and generating a voltage regulator adjustment value based on the compared values.

In another embodiment, the voltage regulator adjustment value comprises an offset value and a gain value. Additionally, the method may include applying a first known electrical load, receiving a first measured output characteristic, comparing the first known electrical load with the first measured output characteristic, and applying a second known electrical load, receiving a second measured output characteristic, and comparing the second known electrical load with the second measured output characteristic. The offset value may then be determined based on the first comparing and the second comparing. In addition, the method may include iteratively performing the selecting, the applying, the receiving, the comparing, and the generating for each of a plurality of phases of the voltage regulator.

In one embodiment, the method includes initializing the voltage regulator over a digital communication bus, where the digital communication bus is one of a power management bus, a system management bus, a SVID bus, or an I2C bus. In another embodiment, the method includes storing the generated voltage regulator adjustment value and updating the voltage regulator with the generated voltage regulator adjustment value.

Another aspect of the present disclosure provides for an apparatus which may include a computing device coupled with a memory. The computing device may be configured to select a known electrical load, apply the known electrical load to a voltage regulator, receive, from the voltage regulator via a digital communication bus, measured output power characteristics of the voltage regulator, compare the known electrical load with the measured output power characteristics, and generate a voltage regulator adjustment value based on the comparing.

Yet another aspect of the present disclosure provides for a computer-readable medium having computer executable instructions for performing a method for calibrating a voltage regulator. The method, in one embodiment, includes selecting a known electrical load, applying the known electrical load to a voltage regulator, and receiving measured output power characteristics of the voltage regulator. The method may also include comparing the known electrical load with the measured output power characteristics, and generating a voltage regulator adjustment value based on the compared values.

BRIEF DESCRIPTION OF THE DRAWINGS

For detailed understanding of the present disclosure, references should be made to the following detailed description of the several aspects, taken in conjunction with the accompanying drawings, in which like elements have been given like numerals and wherein.

DETAILED DESCRIPTION

Before the present systems, methods, and computer-readable mediums are described, it is to be understood that this disclosure is not limited to the particular apparatus, systems and methods described, as such may vary. One of ordinary skill in the art should understand that the terminology used herein is for the purpose of describing possible aspects, embodiments and/or implementations only, and is not intended to limit the scope of the present disclosure which will be limited only by the appended claims.

It must also be noted that as used herein and in the appended claims, the singular forms "a", "and", and "the" may include plural referents unless the context clearly dictates otherwise. Thus, for example, reference to "a voltage regulator" refers to one or several voltage regulators, and reference to "a method of processing" includes reference to equivalent steps and methods known to those skilled in the art, and so forth.

For purposes of this disclosure, an embodiment of an Information Handling System (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS may be a personal computer, a storage device, or any other suitable device and may vary in size, shape, performance, functionality, and price. The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to transmit data communications between the various hardware components.

Figure 1:
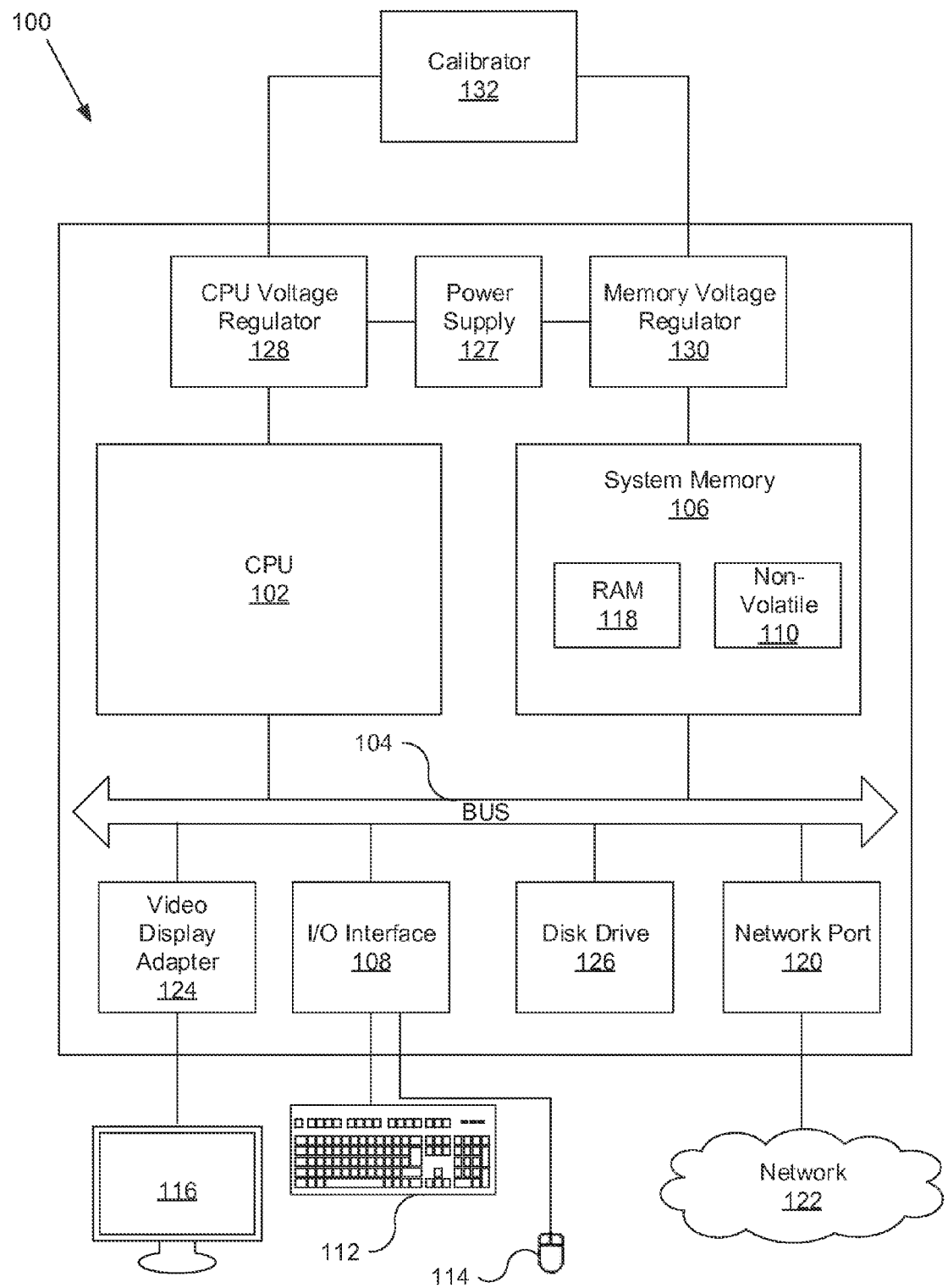
FIG. 1 is a schematic block diagram illustrating one embodiment of an information handling system ("IHS") in accordance with embodiments of the disclosure.

FIG. 1 is a schematic block diagram illustrating one embodiment of an information handling system ("IHS") in accordance with embodiments of the disclosure. It should be understood that the present disclosure has applicability to IHSs as broadly described above, and is not intended to be limited to the IHS 100 as specifically described. The CPU 102 or controller may comprise a processor, a microprocessor, minicomputer, or any other suitable device, including combinations and/or a plurality thereof, for executing programmed instructions. It is appreciated that execution of the algorithm to be described below may occur in the processor or the CPU 102. The CPU 102 may be in data communication over a local interface bus 104 with components including memory 106 and input/output interfaces 108. The system memory 106, as illustrated, may include non-volatile memory 110. The non-volatile memory 110 may include, but is not limited to, flash memory, non-volatile random access memory (NVRAM), and electrically erasable programmable read-only memory (EEPROM). The non-volatile memory 110 may contain a firmware program (not shown) which may contain programming and/or executable instructions required to control a keyboard 112, mouse 114, video display 116 and/or other input/output devices not shown here. This type of firmware may be known as a basic input/output system (BIOS). The system memory 106 may also comprise random access memory (RAM) 118. The operating system and application programs (e.g., graphical user interfaces) may be loaded into the RAM 118 for execution.

The IHS 100 may be implemented with a network port 120 to permit communication over a network 122 such as a local area network (LAN) or a wide area network (WAN), such as the Internet. As understood by those skilled in the art, IHS 100 implementations may also include an assortment of ports and interfaces for different peripherals and components, such as video display adapters 124, disk drives port 126, and input/output interfaces 108 (e.g., keyboard 112, mouse 114).

Furthermore, the IHS 100 may include multiple voltage regulators that regulate input voltage from a power source to a specific voltage required by various IHS components, such as CPU, memory, and/or the like. Specifically the IHS 100 may include a CPU voltage regulator 128 coupled to the CPU 102 to provide a constant level of power to the CPU 102 according to its power requirements. To this end, the CPU voltage regulator 128 may use a negative feedback loop by comparing its actual output voltage to an internal fixed reference voltage. If the output voltage is less than or below a predetermined level, the CPU voltage regulator 128 may produce a higher voltage. In one embodiment, the voltage regulators 128, 130 communicate information (e.g., electrical power characteristics) to other components of the IHS 100 via, for example, a management bus (see FIG. 2) such as a system management bus (SMBus), a power management bus (PMBus), an SVID bus, an I2C bus, and/or a variety of other communication systems. Alternatively, the power supply 127 is configured to report this information.

On the other hand, if the output voltage greater than or above a predetermined level, the CPU voltage regulator 128 may either produce a lower voltage or stop sourcing current. If the CPU voltage regulator 128 is chosen to stop sourcing current, it may depend on the current draw of the device it is driving, e.g., CPU 102, to pull the voltage back down. In this manner, the CPU voltage regulator 128 may maintain the output voltage at a relatively constant level. Additionally, the CPU voltage regulator 128 may be capable of operating in multiple phases and may be operable to supply high output currents. To this end, a multiphase voltage regulator may be able to reduce the amplitudes of input and output ripple current as well as output ripple voltage. Furthermore, during periods of lighter load requirements, a multiphase voltage regulator may be capable of reducing the number of operating phases to increase the efficiency of the voltage regulator.

In certain embodiments, the memory voltage regulator 130 operates in a manner substantially similar to that of the CPU voltage regulator 128 described above. In alternative embodiments, a single voltage regulator provides regulated power to both the CPU 102, system memory 106, and other components of the IHS 100.

CPU manufacturers generally support CPU or processor performance states (P-states) which are defined by the Advanced Configuration and Power Interface (ACPI) specification. P-states are used to optimize the processor for performance per watt of electricity used. The maximum P-state generally corresponds to the processor's maximum (Pmax) supported operating frequency; whereas the minimum P-state (Pmin) generally corresponds to the processor's minimum supported operating frequency. Different processors may support a range of P-states that correspond to frequencies between the minimum and maximum. A secondary effect to P-state transitions is that the processor may also adjust its core voltage to match the new frequency, thus providing additional power savings at lower P-states.

IHS 100 platforms may support a CPU 102 stack with a wide range of power requirements. Thus the CPU voltage regulator 128 is sized for the highest powered processor. Power management algorithms, may use P-states to manage a processor's performance for a given workload, thus optimizing the CPU's 102 power consumption. For example, a CPU 102 with 130 watt thermal design power (TDP) may be managed to operate at a significantly lower wattage. In some embodiment, the CPU 102 may support enhanced power capping capabilities. Processor P-States are one of the main controls the IHS 100 uses to cap power consumption.

CPU voltage regulator efficiency curves generally show that CPUs 102 are most efficient under a heavy load and least efficient under a light load. The CPU voltage regulator 128 may be sized for the highest powered CPU 102 that is supported in the IHS 100. Thus, power management solutions that manage processor P-states may cause the CPU voltage regulator 128 to operate on the lower part of the efficiency curve. Additionally, power capping by limiting the available processor P-states may cause the CPU voltage regulator 128 to operate on the lower part of the efficiency curve.

Both the CPU voltage regulator 128 and the memory voltage regulator 130 are configured to measure and report output voltage and current provided to the CPU 102 and the system memory 106, respectively. The CPU 102, for example, may rely upon the reported voltage and current in making performance decisions. If the CPU voltage regulator 128 is reporting inaccurate voltage and current readings, the CPU 102 may make performance decisions that are not optimal. For example, if the CPU voltage regulator 128 is over-reporting the voltage and current, the CPU 102 may decide to implement power capping algorithms based on a determination that the CPU 102 is approaching a temperature or power threshold, which results in reduced CPU 102 performance.

In one embodiment, a calibrator 132 is in communication with the CPU voltage regulator 128 and the memory voltage regulator 130, and is configured for determining if either of the voltage regulators 128, 130 are reporting inaccurately, and if so, the calibrator 132 is configured for calculating an adjustment so that voltage regulator values or measurements are accurate. The calibrator 132 will be described in greater detail below with reference to FIGS. 2-6.

Figure 2:
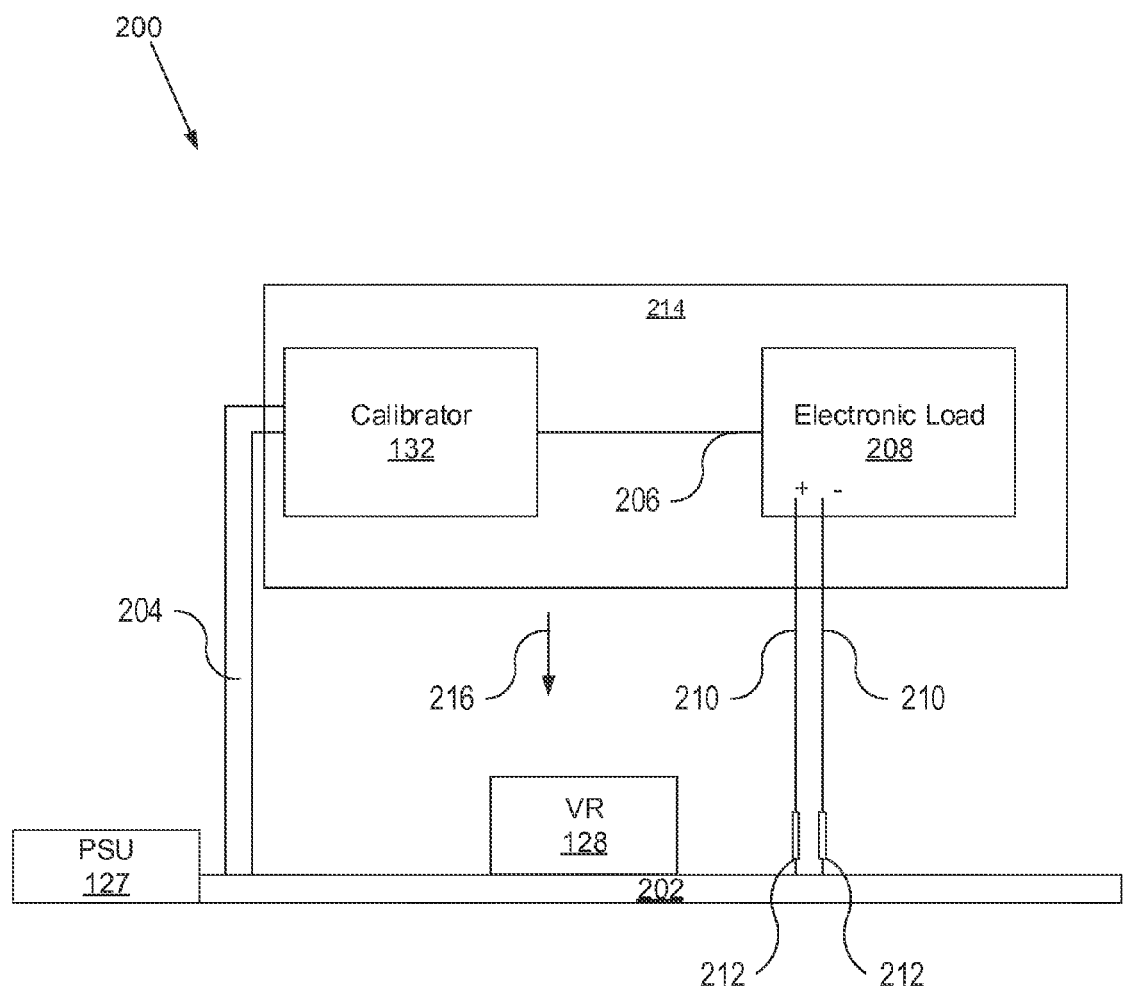
FIG. 2 is a schematic block diagram illustrating one embodiment of a voltage regulator calibration system in accordance with embodiments of the disclosure.

FIG. 2 is a schematic block diagram illustrating one embodiment of a voltage regulator calibration system 200 in accordance with embodiments of the disclosure. The system 200, in one embodiment, is configured for applying a known load and reading the electrical power characteristics (i.e., voltage and current) as measured by the voltage regulator 128. Although the discussion regarding FIGS. 2-6 may relate to the CPU voltage regulator 128, it is to be understood that the described systems and methods apply equally to the memory voltage regulator 130 and/or multiple CPU voltage regulators, multiple memory voltage regulators, or other component voltage regulators.

Although many of the components of the IHS 100 have been omitted from the depiction of FIG. 2 for clarity, it is to be understood that the motherboard 202, in one embodiment, supports the various configurations of the IHS 100 described above with reference to FIG. 1. As discussed, a power supply unit ("PSU") 127 provides power to the voltage regulator 128. The voltage regulator 128 may include various components such as inductors, capacitors, etc. The voltage regulator 128 is configured to receive power from the power supply unit 127 and regulates the power to approximately 1.1 volt DC, or any other value, usable by the processor 102.

In some embodiments, the voltage regulator 128 may report inaccurate electrical power characteristics to the CPU or other components. The calibrator 132 is configured to analyze the electrical power characteristics that the voltage regulator 128 reports and compare the reported electrical power characteristics with a known load applied to the motherboard 202. The calibrator 132 communicates with the voltage regulator 128 via a management bus 204. As mentioned previously, the management bus 204 may be any digital bus capable of communicating with the voltage regulator 128, including but not limited to a SMBus, PMBus, etc. In alternative embodiments, the management bus 204 may be a proprietary bus such as SVID by Intel of Santa Clara, Calif.

The calibrator 132 is also configured to communicate with an electronic load 208 via a general purpose interface bus 206. The electronic load 208, in one embodiment, is a programmable load or power supply. One example of a programmable load capable of use with embodiments of the present disclosure is the Sorensen SLH-60-360-1800 by Ametek of San Diego, Calif. Via the general purpose interface bus 206, the electronic load 208 receives commands from the calibrator 132 and applies a known load corresponding to the command from the calibrator 132. The electronic load 208 may be coupled to the motherboard via probes 210 as depicted. In a further embodiment, the probes (or pins) 210 may be oriented in an overlay fixture that corresponds to a particular motherboard 202. In other words, an overlay fixture 214 may be configured with probes 210 positioned corresponding to probe points 212 on the motherboard 202 so that when the overlay fixture 214 is coupled (or lowered on to, in a direction indicated by arrow 216) the motherboard 202, the probes 210 contact the probe points 212 of the motherboard 202.

Figure 3:
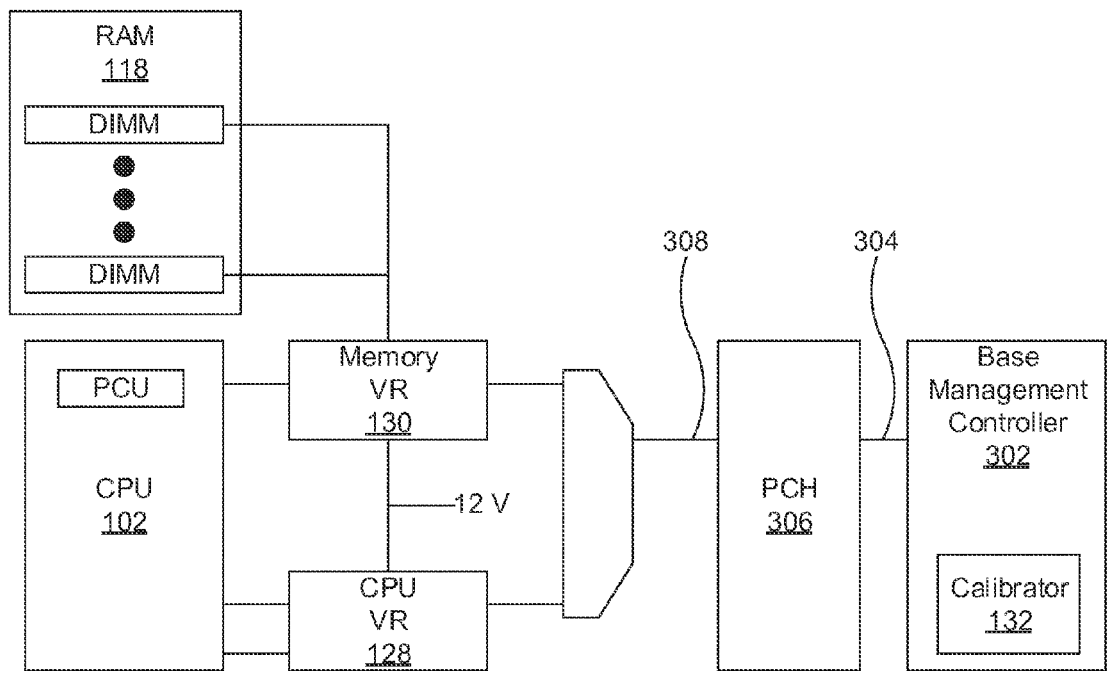
FIG. 3 is another embodiment of a system for calibrating a voltage regulator in accordance with embodiments of the present disclosure.

FIG. 3 is another embodiment of a system 300 for calibrating voltage regulator in accordance with embodiments of the present disclosure. In the depicted embodiment, the calibrator 132 is configured to operate as part of a base management controller 302. In one embodiment, the base management controller 302 is an out of band (or sideband) controller that provides management facilities such as remote management even when the IHS 100 is powered off. The base management controller 302 may be an add-in card coupled with the IHS 100 via the motherboard. Alternatively, the base management controller 302 may be integrated on the motherboard. One example of a base management controller 302 suitable for use with embodiments of the present disclosure includes, but is not limited to integrated Dell remote access controller ("iDRAC") by Dell. The calibrator 132, in one embodiment, communicates with the voltage regulators 128, 130 via the communication bus 304. As discussed above, the communications bus 304 may be a PMBus. Another example of a communication bus includes, but is not limited to intelligent platform management bus ("IPMB") by Intel.

In one embodiment, a platform controller hub 306 is implemented on the motherboard (see FIG. 2). The platform controller hub 306 is configured for controlling data paths to the various components of the motherboard. In particular, the platform controller hub 306 is configured to allow the calibrator 132, via the base management controller 302, to interface with either the CPU voltage regulator 128 or the memory voltage regulator 130.

Figure 4:
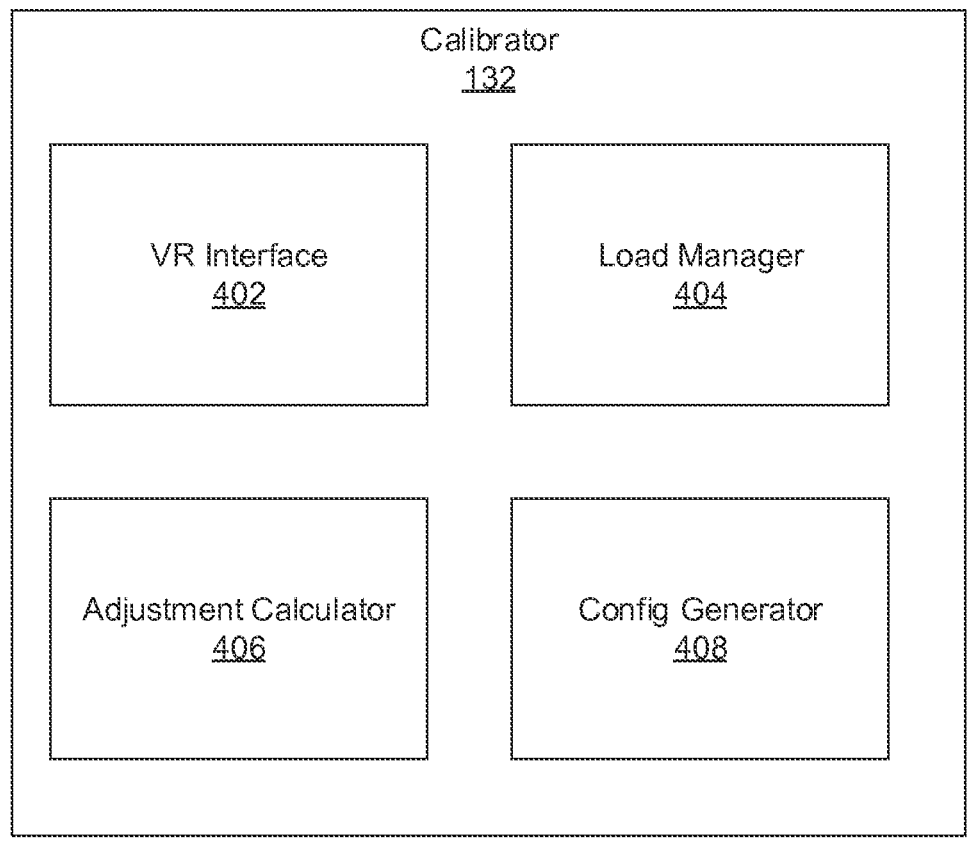
FIG. 4 is a schematic block diagram illustrating one embodiment of a calibrator in accordance with embodiments of the present disclosure.

FIG. 4 is a schematic block diagram illustrating one embodiment of a calibrator 132 in accordance with embodiments of the present disclosure. In one embodiment, the calibrator 132 includes a voltage regulator interface 402, a load manager 404, an adjustment calculator 406, and a configuration generator 408. Beneficially, the calibrator 132 is configured for calibrating voltage regulators. In particular, the calibrator 132 compares power input and/or output characteristics as measured by the voltage regulator with actual known power characteristics. As such, the calibrator 132 is able to determine accurate offset values, and provide those offset values to the voltage regulator so that future reported power characteristics by the voltage regulator are accurate. Additionally, the calibrator 132 is configured to determine offset values for individual phases of the voltage regulator. This is beneficial for providing accuracy improvements when combined with other voltage regulator power management features such as phase shedding.

In one embodiment, the calibrator 132 is configured to communicate, via the voltage regulator interface 402, with one or more voltage regulators and retrieve electrical power characteristics as measured by the one or more voltage regulators. The voltage regulator interface 402 is configured for communicating with the voltage regulators, as discussed above, by a digital communication bus. The digital communication bus may be a standard communication bus (e.g., SMBus, PMBus, etc.) or a proprietary bus. The voltage regulator interface 402 may be configured for polling the voltage regulators at regular predefined intervals. In an alternative embodiment, the voltage regulator interface 402 may be configured for on-demand communication with the voltage regulators.

In one embodiment, the load manager 404 is configured with predetermined values for testing. For example, the predetermined values may be obtained by analyzing dynamic power operational ranges of the CPU 102 or the system memory 106 by using power and thermal algorithm usage models. The analyzing determines which operational ranges benefit from voltage regulation calibration. Calibration of the voltage regulator 128, 130 may occur without the presence of the CPU 102 or system memory 106. In another embodiment, the load manager 404 is configured for identifying values for a testing load. Stated differently, the load manager 404 identifies, for example, processor power states or voltage regulator phases for testing and instructs the electronic load (see FIG. 2) to apply the identified load to the motherboard. In one embodiment, the load manager 404 is configured to identify at least one testing value. In another embodiment, the load manager 404 is configured to identify at least two testing values. Once the load manager 404 has instructed the electronic load to apply the identified testing value, the load manager 404 instructs the voltage regulator interface 402 to monitor the power characteristics measured by the voltage regulator. The voltage regulator interface 402, in one embodiment, is configured to communicate the monitored power characteristics with the adjustment calculator 406.

The adjustment calculator 406, in one embodiment, is configured to compare the monitored (or measured) power characteristics with the identified testing value and calculate an adjustment based on the comparison. For example, if the load manager 404 has instructed the electronic load to apply a load of 5 A, and the power characteristic measured by the voltage regulator is 6 A, the adjustment calculator 406 is configured to calculate an adjustment based on the comparison. In certain embodiments, the adjustment calculator 406 utilizes at least two identified and measured power characteristics to determine the adjustment to be applied to the voltage regulator by way of a voltage regulator configuration file. As used herein, the term "adjustment" refers to any alteration to be made by the voltage regulator to compensate for inaccuracies in measured power characteristics versus actual power characteristics.

In one embodiment, the adjustment is not merely a fixed adjustment, but increases linearly. For example, given a 5 A input the voltage regulator may measure 6 A, and at 20 A, the voltage regulator may measure 25 A. The adjustment calculator 406 may be configured for determining an adjustment that includes a gain and an offset to be applied to the voltage regulator. By utilizing multiple test and measured values, an equation may be developed that is applicable by the voltage regulator for adjusting the power characteristics at any voltage or current. One example of an equation suitable for use includes:

$$Io = m * Ivr + c \quad (1)$$

where Io refers to the test value current, Ivr refers to the measured power characteristic, m refers to a gain, and c refers to an offset. By using multiple test and measured values, values for gain and offset may be obtained for each individual voltage regulator, and within each voltage regulator, each phase of the voltage regulator. Other suitable equations are contemplated.

The configuration generator 408 is configured to generate a configuration for the voltage regulator based on the values determined by the adjustment calculator. The configuration generator 408, in one embodiment, generates a configuration file for loading into the voltage regulator. In another embodiment, the configuration generator 408 updates gain and offset values stored in a registry within the voltage regulator. Alternatively, a voltage regulator manager, which manages all voltage regulators, may store the registry containing the gain and the offset. Stated differently, the configuration generator 408 is configured to update the gain and offset of the voltage regulator wherever those values may be stored.

The present disclosure is described hereinafter with reference to flowchart and/or block diagram illustrations of methods, systems, and computer program products according to an embodiment of the disclosure. It will be understood that each block of the flowchart and/or block diagram illustrations, and combinations of blocks in the flowchart and/or block diagram illustrations, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, implement the functions specified in the flowchart and/or block diagram block or blocks.

Figure 5:
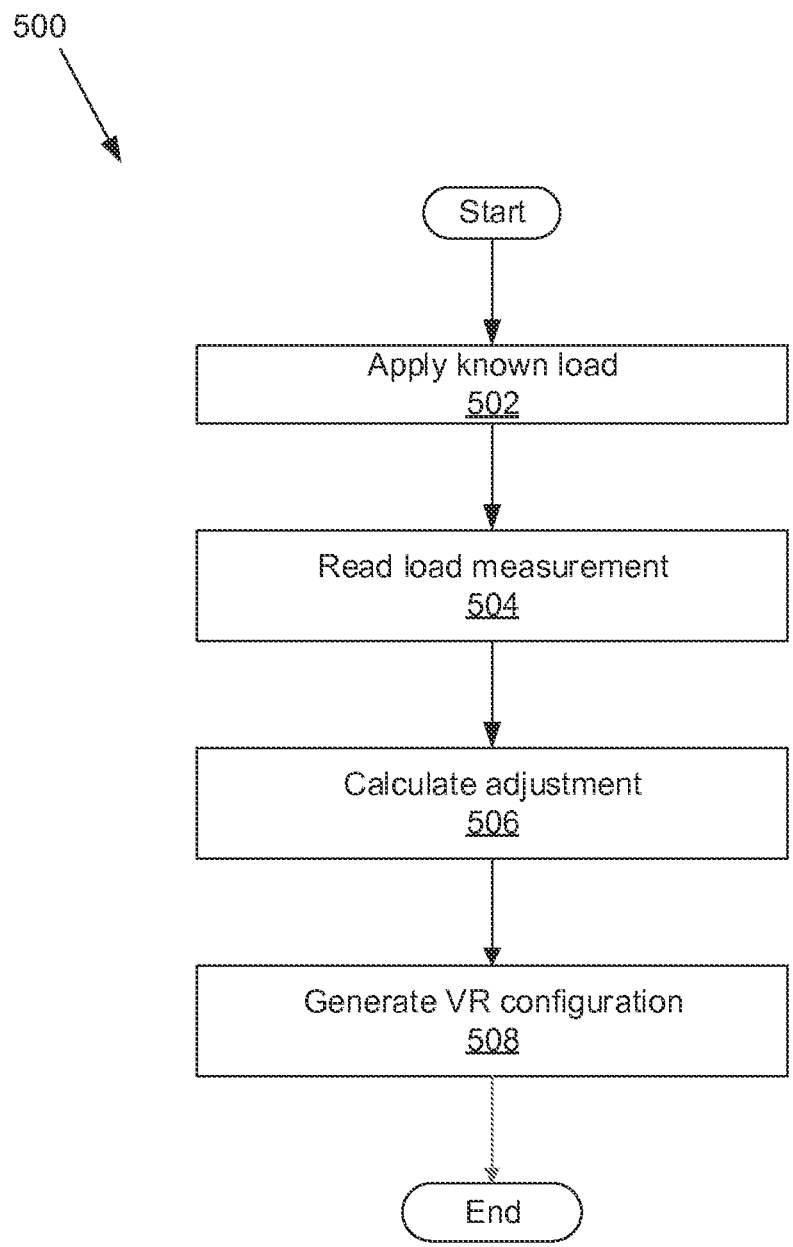
FIG. 5 illustrates a flow diagram of one embodiment of a method for calibrating voltage regulators.

FIG. 5 illustrates a flow diagram of one embodiment of a method 500 for calibrating voltage regulators. The method is performed by processing logic that may comprise hardware (circuitry, dedicated logic, etc.), software (such as is run on a general purpose computer system or a dedicated machine), or a combination of both. In one embodiment, the method is performed by a calibrator (e.g., calibrator 132 of FIG. 1).

The method 500 begins and the processing logic, at block 502, applies a known load to a voltage regulator. In one embodiment, the processing logic selects a test load and instructs an electronic load to apply the test load to the voltage regulator. For example, the processing logic may select a test load that corresponds to a specific phase or operating mode of the voltage regulator. The phase may correspond to a power state of a processor or other component. The processing logic may be configured to perform the method 500 for each individual phase of the voltage regulator, or in another embodiment, the processing logic may perform the method once for the voltage regulator. Alternatively, the processing logic may perform the method in response to an indication that the voltage regulator has changed operating modes (i.e., transitioned from one constant voltage to a second constant voltage). For example, if the voltage regulator is a dynamic-voltage voltage regulator, the processing logic may be configured to iteratively perform the method 500 for each change in voltage.

At block 504, the processing logic reads or receives from the voltage regulator measured power characteristics. In one embodiment, the processing logic communicates with the voltage regulator over a digital bus such as, but not limited to, SMBus, or PMBus. The processing logic then, at block 506, calculates voltage regulator adjustments. In one embodiment, the processing logic calculates voltage regulator adjustments by comparing one or more test load values with corresponding measured power characteristics. The processing logic, for example, may determine a gain value and an offset value based on the one or more test load values.

At block 508, the processing logic generates the voltage regulator configuration. In one embodiment, the processing logic generates the voltage regulator configuration by generating a configuration file that is then loaded on to the voltage regulator. In another embodiment, the processing logic generates gain and offset values and writes those values to a registry that is either local or remote to the voltage regulator. The method 500 then ends.

Figure 6:
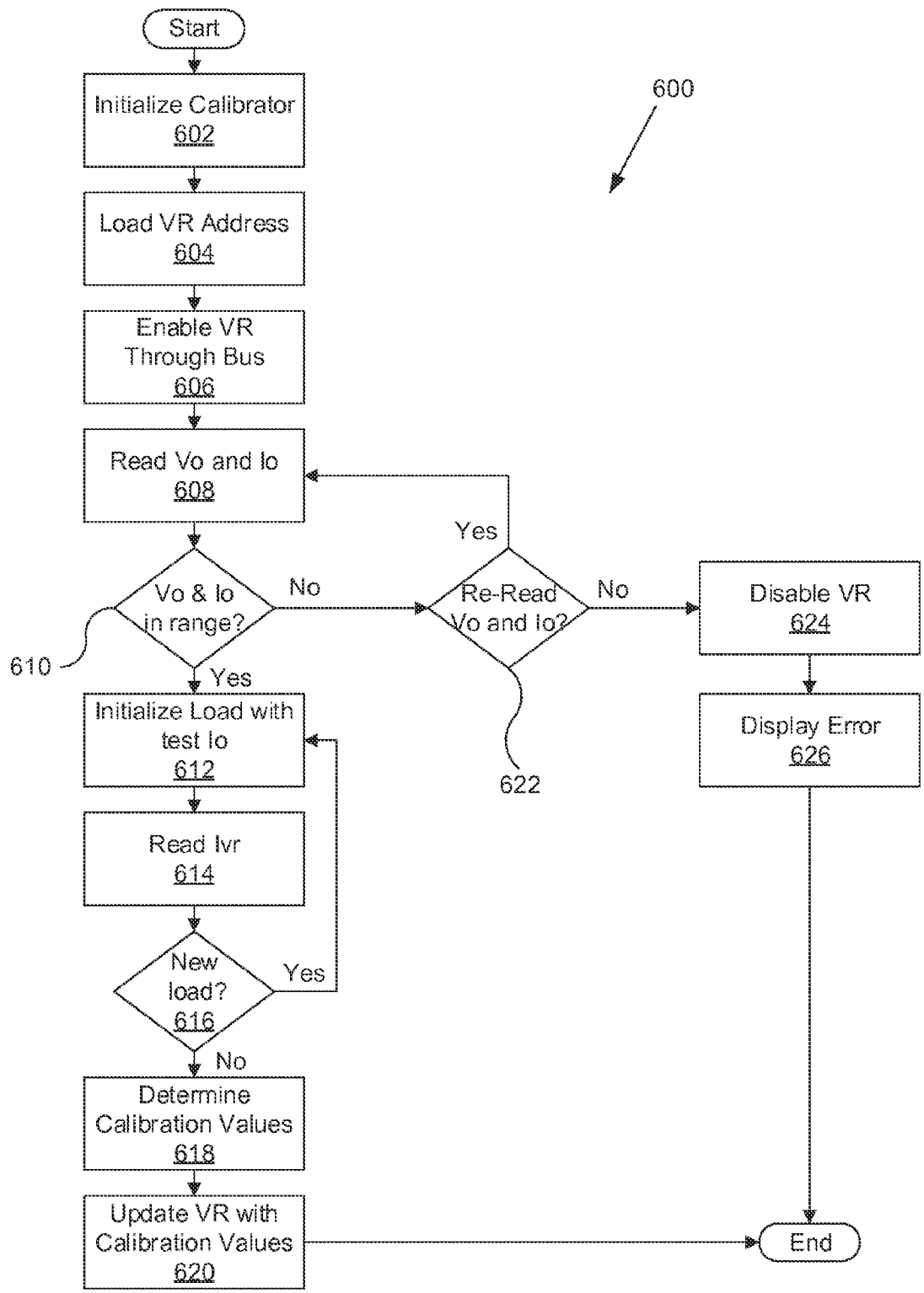
FIG. 6 illustrates a flow diagram of one embodiment of a method for calibrating voltage regulators in accordance with embodiments of the disclosure.

FIG. 6 illustrates a flow diagram of one embodiment of a method 600 for calibrating voltage regulators in accordance with embodiments of the disclosure. The method is performed by processing logic that may comprise hardware (circuitry, dedicated logic, etc.), software (such as is run on a general purpose computer system or a dedicated machine), or a combination of both. In one embodiment, the method is performed by a calibrator (e.g., calibrator 132 of FIG. 1).

The method 600 begins and the processing logic initializes, at block 602, the calibrator. In one embodiment, the processing logic initializes the calibrator by initializing calibrator logic operable on a base management controller. At block 604, the processing logic loads voltage regulator addresses. In one embodiment, voltage regulator addresses are hardware addresses that allow the processing logic to communicate with the voltage regulator via a digital communication bus. At block 606 the processing logic enables the voltage regulator through the bus.

At block 608 the processing logic reads, via the voltage regulator, output power characteristics as measured by the voltage regulator. In one embodiment, output power characteristics include an output voltage (Vo) and an output current (Io). If, at decision block 610, the processing logic determines the power characteristics are in an acceptable range, the processing logic continues to initialize, at block 612, an electrical test load. The processing logic, in one embodiment, selects a test load based on the voltage regulator and the attached component. For example, the processing logic might determine that a certain processor has defined power states, and select a test load based on the power states. The processing logic then instructs an electronic load to apply the test load to the voltage regulator, as described above.

At block 614, the processing logic communicates with the voltage regulator and reads or receives the measured power characteristics (Ivr) as measured by the voltage regulator. The processing logic may determine, at decision block 616, to test additional test loads, and if so, proceeds to block 612. If not, the processing logic determines, at block 618 calibration adjustment values. In one embodiment, the processing logic determines calibration adjustment values by comparing measured power characteristics with known test load values and calculating, for example, an offset and a gain. The processing logic then, at block 620, updates the gain and the offset of the voltage regulator. The method 600 as described may be repeated for each voltage regulator and each phase of each voltage regulator.

Returning to decision block 610, the processing logic may determine that the measured power characteristics are not in range and may attempt to re-read the power characteristics at decision block 622. If, for example after a number of failed reads, the processing logic determines to not re-read the output, the processing logic at block 624 disables the communication channel with the voltage regulator and displays an error at block 626. The method 600 then ends.

Furthermore, methods of the present disclosure, detailed description and claims may be presented in terms of logic, software or software implemented aspects typically encoded on a variety of media or medium including, but not limited to, computer-readable medium/media, machine-readable medium/media, program storage medium/media or computer program product. Such media, having computer-executable instructions, may be handled, read, sensed and/or interpreted by an IHS. Generally, computer-executable instructions, such as program modules, may include routines, programs, objects, components, data structures, and the like, which perform particular tasks, carry out particular methods or implement particular abstract data types. Those skilled in the art will appreciate that such media may take various forms such as cards, tapes, magnetic disks (e.g., floppy disk or hard drive) and optical disks (e.g., compact disk read only memory ("CD-ROM") or digital versatile disc ("DVD")). It should be understood that the given implementations are illustrative only and shall not limit the present disclosure.

Although the present disclosure has been described with reference to particular examples, embodiments and/or implementations, those skilled in the art will recognize that modifications and variations may be made without departing from the spirit and scope of the claimed subject matter. Such changes in form and detail, including use of equivalent functional and/or structural substitutes for elements described herein, fall within the scope of the appended claims and are intended to be covered by this disclosure.

We claim:

1. A method, comprising:
   selecting a known electrical load;
   applying the known electrical load, using a programmable load device that is external to an Information Handling System (IHS) and coupled to a motherboard of the IHS via probes oriented in an overlay fixture, to a voltage regulator configured to provide a regulated electrical output to a component of the IHS, where the applying occurs while the component is disconnected from the motherboard;
   receiving, from the voltage regulator via a digital communication bus, measured output power characteristics of the voltage regulator;
   comparing the known electrical load with the measured output power characteristics; and
   generating a voltage regulator adjustment value based on the comparing.

2. The method of claim 1, where the voltage regulator adjustment value comprises an offset value and a gain value.

3. The method of claim 2, further comprising:
   first applying a first known electrical load, receiving a first measured output characteristic, and comparing the first known electrical load with the first measured output characteristic;
   second applying a second known electrical load, receiving a second measured output characteristic, and comparing the second known electrical load with the second measured output characteristic; and calculating the offset value and the gain value based on the first applying and the second applying.

4. The method of claim 1, further comprising iteratively performing the selecting, the applying, the receiving, the comparing, and the generating for each of a plurality of phases of the voltage regulator.

5. The method of claim 1, further comprising initializing the voltage regulator over a digital communication bus.

6. The method of claim 5, where the digital communication bus is one of a power management bus, a system management bus, a SVID bus, or an I2C bus.

7. The method of claim 1, further comprising storing the generated voltage regulator adjustment value and updating the voltage regulator with the generated voltage regulator adjustment value.

8. A memory device having program instructions stored thereon that, upon execution by a processing device, cause the processing device to:

select a known electrical load;
apply the known electrical load to a voltage regulator using a programmable load device coupled to a motherboard of the IHS via probes oriented in an overlay fixture, where the voltage regulator is configured to provide a regulated electrical output to a component of the IHS;
receive, from the voltage regulator via a digital communication bus, measured output power characteristics of the voltage regulator;
compare the known electrical load with the measured output power characteristics; and
generate a voltage regulator adjustment value based on the comparing.

9. The memory device of claim 8, where the voltage regulator adjustment value comprises an offset value and a gain value.

10. The memory device of claim 9, wherein the program instructions, upon execution, further cause the processing device to:

first apply a first known electrical load, receive a first measured output characteristic, and compare the first known electrical load with the first measured output characteristic;
second apply a second known electrical load, receive a second measured output characteristic, and compare the second known electrical load with the second measured output characteristic; and
calculate the offset value and the gain value based on the first applying and the second applying.

11. The memory device of claim 8, wherein the program instructions, upon execution, further cause the processing device to:

iteratively perform the selecting, the applying, the receiving, the comparing, and the generating for each of a plurality of phases of the voltage regulator.

12. The memory device of claim 8, wherein the program instructions, upon execution, further cause the processing device to initialize the voltage regulator over a digital communication bus.

13. The memory device of claim 12, where the digital communication bus is one of a power management bus, a system management bus, a SVID bus, or an I2C bus.

14. The memory device of claim 8, wherein the program instructions, upon execution, further cause the processing device to update the voltage regulator with the generated voltage regulator adjustment value.

15. A computing device, comprising:

a processor; and
a memory coupled to the processor and configured to store program instructions that, upon execution by the processor, cause the computing device to:
select a known electrical load;
apply the known electrical load to a voltage regulator using a programmable load device that is external to the computing device and coupled to a motherboard of the computing device via probes oriented in an overlay fixture, where the voltage regulator is configured to provide a regulated electrical output to a component of an Information Handling System (IHS), and where the applying occurs while the component is absent from the IHS;
receive, from the voltage regulator via a digital communication bus, measured output power characteristics of the voltage regulator;
compare the known electrical load with the measured output power characteristics; and
generate a voltage regulator adjustment value based on the comparing.

16. The computing device of claim 15, where the voltage regulator adjustment value comprises an offset value and a gain value.

17. The computing device of claim 16, where the computing device is further configured to iteratively identify a plurality of formatting instructions in a logging stream.

18. The computing device of claim 15, wherein the computing device is further configured to:

first apply a first known electrical load, receive a first measured output characteristic, and compare the first known electrical load with the first measured output characteristic;
second apply a second known electrical load, receive a second measured output characteristic, and compare the second known electrical load with the second measured output characteristic; and
calculate an offset value and a gain value based on the first applying and the second applying.

19. The computing device of claim 15, where the computing device is further configured to iteratively select, apply, receive, compare, and generate for each of a plurality of phases of the voltage regulator.

20. The computing device of claim 15, where the computing device is further configured to iteratively select, apply, receive, compare, and generate in response to an indication of a change in voltage of the voltage regulator.

21. The computing device of claim 15, where the computing device is further configured to store the generated voltage regulator adjustment value in a non-volatile storage device, where the non-volatile storage device is coupled with the voltage regulator.

* * * * *